(12) United States Patent
Stoddard

(10) Patent No.: US 8,936,652 B2
(45) Date of Patent: Jan. 20, 2015

(54) METHOD FOR MANUFACTURING SILICON BLOCKS

(71) Applicant: SolarWorld Industries America Inc., Hillsboro, OR (US)

(72) Inventor: Nathan Stoddard, Beaverton, OR (US)

(73) Assignee: SolarWorld Industries America Inc., Hillsboro, OR (US)

( * ) Notice: Subject to any disclaimer, the term of this patent is extended or adjusted under 35 U.S.C. 154(b) by 108 days.

(21) Appl. No.: 13/721,579

(22) Filed: Dec. 20, 2012

(65) Prior Publication Data

US 2014/0178286 A1 Jun. 26, 2014

(51) Int. Cl.
*C01F 11/32* (2006.01)
*C01B 33/037* (2006.01)

(52) U.S. Cl.
CPC .................................. *C01B 33/037* (2013.01)
USPC ...................................... 23/308 R; 23/295 R

(58) Field of Classification Search
USPC ............................................ 23/208 R, 295 R
See application file for complete search history.

(56) References Cited

U.S. PATENT DOCUMENTS

| 7,981,214 B2 | 7/2011 | Mueller et al. |
| 2012/0175622 A1 | 7/2012 | Krause et al. |

FOREIGN PATENT DOCUMENTS

| DE | 10 2005 013 410 B4 | 1/2008 |
| DE | 10 2011 002 599 A1 | 7/2012 |

*Primary Examiner* — Edward Johnson
(74) *Attorney, Agent, or Firm* — McGlew and Tuttle, P.C.

(57) ABSTRACT

A device for taking up a silicon melt comprises at least one block of a refractory with a capillary structure.

7 Claims, 6 Drawing Sheets

METHOD FOR MANUFACTURING SILICON BLOCKS

FIELD OF THE INVENTION

The invention relates to a device for removing liquid silicon from a crucible. The invention further relates to a method for manufacturing silicon-blocks. Finally the invention relates to silicon-blocks.

BACKGROUND OF THE INVENTION

Silicon ingots can be manufactured by a directional solidification process. Such a process is described in DE 10 2011 002 599 A1, which is hereby incorporated by reference in its entirety.

There is continuous need to improve such a process for the formation of silicon ingots, in particular, to improve the quality of such ingots.

SUMMARY OF THE INVENTION

One object of the current invention is to improve a device for removing contaminated silicon from a crucible.

This object is achieved by a device for removing liquid silicon from a crucible, the device comprising at least one block of a refractory with a capillary structure.

According to the invention, it was found, that at the end of a directional solidification process the last remaining liquid silicon has accumulated a relatively high concentration of metals, which upon solidification can lead to a deterioration of the quality of the already solidified silicon-block. It has further been recognized, that it is thus advantageous, to remove the last liquid silicon at the end of a directional solidification process from the crucible before it solidifies. By that it is possible to remove a large amount of the contaminants accumulated therein. Finally, it has been recognized, that such a removal of liquid silicon can be greatly facilitated by using an impurity sponge made of a refractory to suck up at least some of the remaining liquid silicon in order to remove it from the crucible.

In other words, it was found, that by using a block of a refractory which a capillary structure the removal of liquid silicon from a crucible can be facilitated.

According to an aspect of the invention the block is made of fiber bundles. Thus, it has a fibrous structure. The block can preferably display a fiber matrix structure.

According to another aspect of the invention there are cavities between the fiber bundles. These cavities have a diameter in the range of 10 µm to 100 µm.

The structure of the block comprising fiber bundles with cavities in between them thus forms a pore structure. It forms in particular a pore structure with capillaries. The porosity of the block, defined as the percentage of free space within the nominal space occupied by the block, is preferably in the range of 70% to 95%, in particular in the range of 80% to 95%.

All these features facilitate the taking up, in particular the absorption, of liquid silicon by the impurity sponge.

According to another aspect of the invention the block has a total pore volume of at least 200 cm$^3$, in particular at least 500 cm$^3$, in particular at least 800 cm$^3$. Of course, the total pore volume can be increased by using several blocks, in particular 2, 3, 4 or more blocks as impurity sponges. By providing one or more blocks with a sufficiently large total pore volume it can be ensured, that at least a predetermined amount of liquid silicon can be soaked up by the impurity sponge. The amount of liquid silicon, which can be soaked up by the impurity sponge, is in particular at least 2 kg. It lies in particular in the range of 2 kg to 20 kg.

The size of the impurity sponge, in particular its total pore volume, can advantageously be chosen depending on size, in particular depending on the cross sectional area of the crucible. The total pore volume of the block can in particular be chosen to be at least as large as the cross sectional area of the crucible times 1 cm. It is thus large enough to soak up an amount of liquid silicon corresponding to a layer in the crucible with a depth of 1 cm. By this it was found, that more than 90% of all metal atoms from the entire silicon-melt in the crucible can be soaked up by the impurity sponge and than be removed from the crucible.

According to another aspect of the invention the block is made of insulation material. It comprises in particular at least one of carbon, aluminum and silicon dioxide. It can be made of graphite felt. It can in particular be made of rigidized material, in particular rigidized carbon insulation.

The material of the impurity sponge itself is a consumable in the process according to the invention. It does not need to be of any particular grade. By choosing any of the above mentioned materials it can be ensured, that the impurity sponge can be stored within the hot zone of the apparatus for solidifying the silicon-melt for the entire process. It can in particular be insured, that it interacts at most minimally with the thermal environment. Preferably it does not interact at all with the thermal environment.

The use of any of the above-mentioned insulation materials has the further advantage, that these materials are readily available and comparably cheap.

By using a rigidized material the mechanical handling of the block is greatly facilitated. For the rigidization a standard baking process with a carbon binder can be used.

Preferably the block has an isotropic flexural strength of at least 1 MPa.

According to further aspects of the invention the block is made of a material with a thermal conductivity of less than 1.2 W/(m·K). Preferably, the thermal conductivity of the material of the impurity sponge is at least 0.05 W/(m·K).

The block is preferably made of a material with a bulk density of less than 200 kg/m$^3$. The bulk density of the material can be at least 10 kg/m All these features facilitate the soaking up of liquid silicon and/or the mechanical handling of the impurity sponge.

The block can have a cross-section of at least 25 cm$^2$. Preferably, the cross-section can be in the range of between 10 cm×10 cm and 20 cm×20 cm. The sponge may take any shape, but preferably the bottom has a flat section. The lateral cross-section can be rectangular, in particular square. It can be a scaled version of the cross-section of the crucible. Other cross-sectional shapes, such as a round cross-section, are also feasible.

According to one embodiment of the invention, the block can have a cross-section, whose longest dimension corresponds to a dimension of the crucible for holding the silicon-melt. The block can in particular have a rectangular cross-section, whose longer side is in the range of 0.75 to 0.95 times the length of a side of the crucible.

The block can have a height of at least 5 cm, in particular at least 10 cm, in particular at least 20 cm. It can have an aspect ratio defined as the ratio of its height to a diameter of its cross-section, of at least 0.5, in particular at least 1, in particular at least 2.

The block can be attached to a holding element. The holding element can comprise a graphite rod or it may be composed of another rigid refractory material. The graphite rod can have features at the bottom to tightly attach it to the block. In particular, the rod may have threads at the bottom to be screwed into the block. The block is in particular attached at one end to the holding element. It is preferably attached to the holding element at one and only one end. This is in particular possible due to the rigid structure of the block. It facilitates its handling.

According to a further aspect of the invention the device further comprises a displacement mechanism for vertically displacing the block. By use of the displacement mechanism the impurity sponge can be lowered into contact with the silicon-melt. It can also be raised again. The displacement mechanism preferably comprises an actuator, in particular a motorized actuator. It can further comprise a controlling device for controlling the displacement of the impurity sponge relative to the silicon-melt. By this the relative position of the block to the silicon-melt and/or the solidified silicon can be adjusted flexibly. It can in particular be controlled depending on the position of the topmost surface of the silicon-melt and/or the solidification boundary of the solidifying silicon. It can also be controlled according to a predefine time course. The controller can be an open circuit or a closed circuit controller.

According to another aspect of the invention the displacement mechanism comprises a weighing element for monitoring the weight of the block. The weighing element can be in signal connection with the controller for controlling the displacement of the block. It can also be part of the controlling device. By use of the weighing element it is easily possible to monitor the amount of liquid silicon being soaked up by the impurity sponge.

It is another object of the invention to improve a method for manufacturing silicon-blocks. This objective is solved by a method for manufacturing silicon blocks comprising the steps of providing an apparatus for solidifying a silicon melt, the apparatus comprising a crucible, a temperature controller connected to at least one heating device, and a device according to the invention, providing a silicon melt within the crucible, partly solidifying the silicon melt, bringing the at least one block of the refractory in contact with liquid silicon on top of the solidified silicon in a contacting step, taking up at least a predetermined amount of the liquid silicon with help of the at least one block in a taking up step, and bringing the at least one block of the refractory out of contact with the silicon in the crucible in a removal step. The advantages follow from the features described above.

According to this method a silicon-melt is provided in a crucible and solidified in a directional manner starting from the bottom of the crucible. It is solidified from the bottom towards the top, until at least a predetermined amount, for example 95%, of the silicon-melt is solid. In other words, the silicon-melt is partly solidified. Then the impurity sponge described above is brought in contact with the liquid silicon remaining on top of the solidified silicon in a contacting step. To this end the impurity sponge is lowered into contact with the top surface of the liquid silicon by means of the displacement mechanism.

When the impurity sponge is in contact with the liquid silicon it takes up at least a predetermined amount of this liquid silicon in a taking up process. In particular, the remaining liquid silicon is absorbed at least partly, preferably to at least 50%, in particular at least 75%, in particular at least 90%, in particular at least 95%, in particular at least 99%, in particular completely, by the impurity sponge.

In an advantageous embodiment the weight of the impurity sponge is monitored during the taking up process. In this way it is easily possible to monitor, how much silicon is taken up by the impurity sponge.

After that the block with the soaked up silicon is brought out of contact with the silicon in a crucible in a removal step. In particular, the impurity sponge with the absorbed silicon is raised out of contact with the silicon in a crucible by means of the displacement mechanism.

Then, the assembly, in particular the solidified silicon in the crucible is allowed to cool down to the unloading temperature.

According to an aspect of the invention a heating power is increased during at least part of the taking up process. By this the temperature of the liquid silicon remaining on top of the solidified silicon is raised during at least part of the taking up process, in particular during the entire taking up process.

In particular, according to another aspect of the invention, the heating power, in particular the power supplied by the at least one heating device, is increased during the taking up process such that at least some of the liquid silicon on top of the already solidified silicon in a crucible is prevented from solidifying.

At least one of the heating power and the temperature is raised by at least 5%, in particular by at least 10%, in particular by at least 15%. By increasing the heating power and thereby the temperature of the hot zone, the increased heat loss by radiation from solid silicon being exposed is counteracted and the dendritic solidification of the last liquid silicon is prevented. It is in particular avoided, that the last liquid silicon solidified, whilst it is still in contact with the already solidified silicon in the crucible. Furthermore, by increasing the heating power an unwanted lateral solidification on the top surface of the solidifying silicon-block can be avoided. Even further, the solidification of the liquid in contact with the sponge is avoided, so that the block does not become welded to the ingot.

According to another aspect of the invention the impurity sponge is moved across the surface of the solidified part of the silicon-melt in the crucible. In particular, it can be moved in parallel to the surface of the solidified part of the silicon-melt in the crucible, i.e. in parallel to the solidification boundary. By this the soaking up of the remaining liquid silicon can be enhanced.

According to another aspect of the invention, a cooling power applied to a bottom part of the crucible is decreased during at least part of the taking up process. The cooling power can in particular be decreased during the entire step. It can be decreased by at least 10%. In particular, the cooling power can be entirely switched off during the taking up process.

According to a further aspect of the invention the impurity sponge is raised after the contacting step. It can be raised slightly immediately after having contacted the top surface of the silicon-melt. It is raised by a sufficiently small amount to be still in contact with the liquid silicon.

It can also be raised just before or during the removal step.

It is further possible, to lower the block during the taking up process in order to account for the decreasing height of the top surface of the liquid silicon in the crucible. Advantageously, the height of the silicon-block, in particular the relative position of the impurity sponge with respect to the top surface of the liquid silicon can be flexibly adjusted by means of the displacement mechanism.

A further object of the invention is to improve silicon-blocks. This object is achieved by a silicon block manufactured according to a method according to the invention.

By manufacturing the silicon-blocks according to the method described above the amount of metal impurities in the block, in particular in the top section, also referred to as top cap, of a directionally solidified ingot, can be greatly reduced. Thus, the quality of the silicon block can be greatly enhanced. By decreasing the quantity of impurities frozen into the top of the ingot, the source for diffusion of these impurities is decreased and the overall impurity concentration in the ingot, in particular in the top third of the ingot is dramatically reduced. By this decrease in impurities the minority carrier lifetime of the material is increased and its performance in photovoltaic devices is improved.

In the following more details, features and advantages of the invention will be described by way of some embodiments of the invention with help of the figures.

Figure 1:
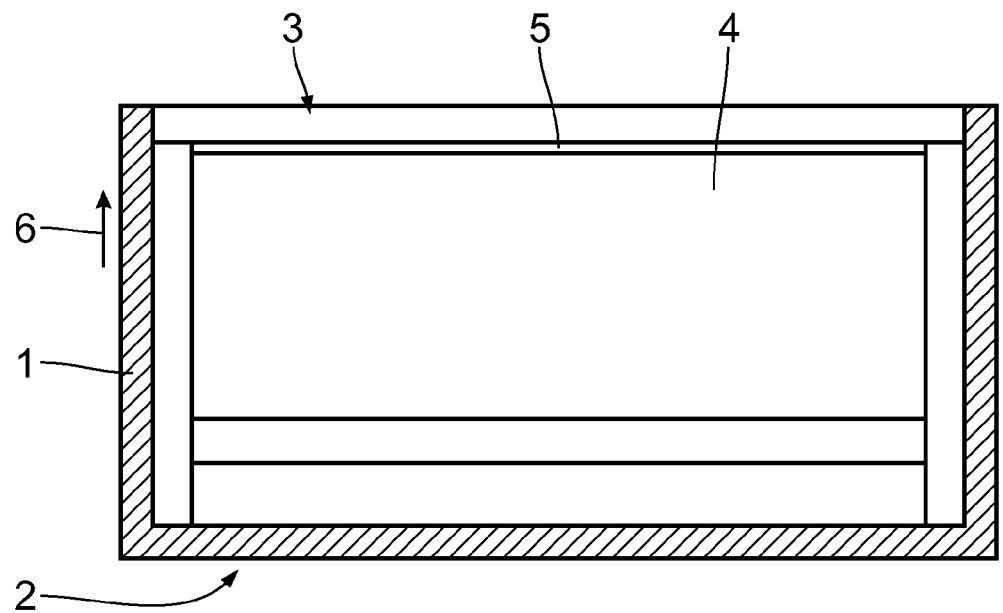
FIG. 1 shows a longitudinal cross section through a silicon ingot immediately after the end of a crystallization process according to the prior art.
Figure 2:
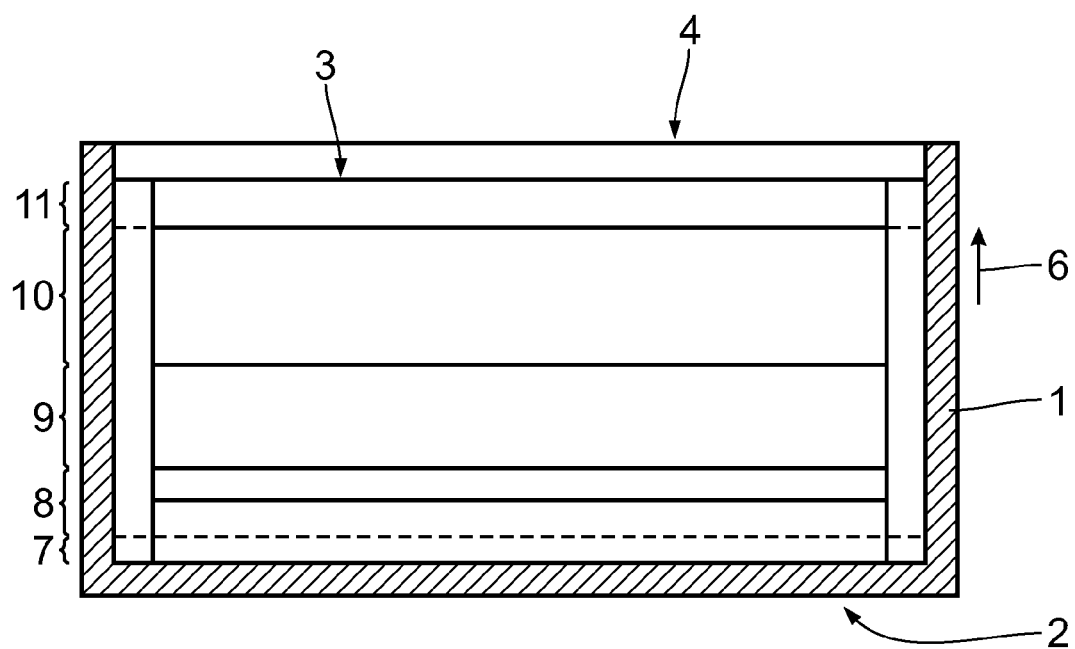
FIG. 2 shows a cross section of the ingot shown in FIG. 1 after complete cool down.

First a prior art process for manufacturing silicon-blocks known as ingots and the thus produced ingots are briefly described with reference to FIGS. 1 and 2. In a directional solidification process, such as a vertical gradient freeze (VGF) process, a silicon-melt is solidified within a crucible 1. The silicon-melt is in particular solidified from a bottom 2 of the crucible 1 towards the top 3. During the solidification contaminants in the silicon melt, in particular metals, accumulate in the not yet solidified, i.e. still liquid silicon at the top 3. The partition goes according to the relative solubilities in liquid compared to the silicon. Most metals have a very low coefficient of segregation, such that the ratio of the concentrations in the liquid and solid will be between $10^4$ and $10^9$. As growth proceeds and impurities are rejected from the solid, the liquid will have increasing concentration, as described by Scheil's equation. At the very end of crystallization, the highly contaminated liquid finally solidifies, trapping the built up impurities. Thus, just after the end of crystallization, there is a layer 5 at the top of the silicon-block 4 comprising most of the contaminants, in particular metals, which were contained in the silicon-melt. The layer 5 has a depth in a longitudinal direction 6 of usually less than 1 cm.

Once the silicon-melt has been completely solidified and is allowed to cool down, metals in the top layer 5 begin to diffuse down into the already solidified silicon-block 4 along a concentration gradient in opposite direction to the longitudinal direction 6. An exemplary result is shown in FIG. 2, from which it can be clearly seen, that a large part of the silicon-block 4 is deteriorated by this diffusion process of metals from the top layer 5. Here, deterioration can be measured and quantified by means of analyzing the lifetime of free charge carriers excited by illumination in the silicon-block 4. Specifically, the lifetime (or the related recombination rate) of minority carriers (holes for n-type silicon and electrons for p-type silicon) is of greatest importance for solar cell devices.

There can be distinguished from the bottom 2 to the top 3 of the silicon-block 4 the following different layers: A bottommost layer 7 with a very low charge carrier lifetime. This bottommost layer 7 has to be cut off. It has an extension in longitudinal direction 6 in the range of about 2 cm to 5 cm. Next there is a bottom gradient layer 8 with a large lifetime gradient. Above the bottom gradient layer 8 there is a layer 9 with high quality silicon. The silicon in layer 9 has a high charge carrier lifetime. Above that and comprising up to half of the silicon ingot in longitudinal direction 6 is a top gradient layer 10, in which the lifetime gradually decreases again.

Finally, there is a top cap 11 of lower quality material. The top cap 11 has an extension in longitudinal direction 6 of about 5 cm. Usually it cannot be recycled directly due to a high amount of contaminants and inclusions.

Clearly, it is not satisfying to lose a large amount of the solidified silicon-block 4 due to a deterioration during the cool down process.

According to the invention it was found, that the quality of silicon-blocks 4 can be greatly enhanced, if the topmost layer 5, which contains the majority of all contaminants from the whole silicon-melt in the crucible 1 is removed from the crucible 1 prior to solidification, i.e. in the liquid state. In the following it will be described how this can be done according to the present invention. Firstly, a device 12 for removing liquid silicon, in particular a layer 22 of liquid silicon, from the crucible 1 is described. The device 12 comprises a block 13 of a refractory with a capillary structure. The block 13 can for example consist of a chunk of insulation material. The block 13 forms an impurity sponge. In general, the block 13 is made of fiber bundles. The fiber bundles form a fibrous matrix. Between the fiber bundles there are cavities with a size in the range of 10 μm to 100 μm. The cavities have in particular a diameter in that range. Thus, the fiber bundles with the cavities form a sponge like pore structure. The porosity of the block 13 is in the range of 70% to 95%, in particular in the range of 80% to 95%. Herein the porosity of the block 13 is defined as the percentage of free space within the nominal space occupied by the block 13.

The block is made of insulation material. It comprises at least one of carbon, aluminum oxide (alumina) and silicon dioxide. It can be made of graphite, in particular graphite felt.

Advantageously, the block is made of rigidized material. It can in particular be a rigid fiber insulation sponge. This is specifically advantageous compared with cloth-like insulation, for example graphite felt, which does not hold its shape under stress and tears easily.

The block 13 has a total pore volume of at least 200 $cm^3$, in particular at least 500 $cm^3$, in particular at least 800 $cm^3$. In order to increase the total pore volume, the device 12 can comprise more than one block 13. The device 12 can in particular comprise at least two, in particular at least three, in particular at least four blocks 13. In case of several blocks 13, they can be arranged in one row or in a matrix comprising more than one row and more than one column. In the case of a convex solid interface, it may be advantageous to locate one block at each corner of the ingot in order not to strand some of the liquid away from the sponge. In general, with a concave or a flat solid/liquid interface, it is not necessary to put blocks in more than one place because the block effectively sucks up the liquid from across the surface into the sponge.

The size of the block 13, in particular the size of the total pore volume, is appropriate to soak up at least 2 kg of liquid silicon. The size of the block 13 is in particular appropriate to soak up between 2 kg and 20 kg of liquid silicon.

The block 13 is made of a material with a thermal conductivity of less than 1.2 W/(m·K). Preferably, the material of the block 13 has a thermal conductivity of at least 0.05 W/(m·K). This has been proven to be advantageous for controlling the reaction, in particular the solidification of the liquid silicon soaked up into the block 13 with the block 13 itself.

The block 13 is in particular made of a material which interacts at most minimally, preferably not at all with the thermal environment of the silicon solidification apparatus. This is possible with a refractory material, where the mass is low and the insulation factor is high, such that it quickly reaches the temperature of the surrounding environment with a minimum of extra energy.

The block 13 is made of a material with a bulk density of less than 200 kg/m$^3$. In other words, the block 13 is made of a very lightweight, low density material. The material of the block 13 can have bulk density of at least 10 kg/m$^3$.

The block 13 is a consumable in the process according to the invention. It does not need to be of any particular grade.

The block 13 has an isotropic flexural strength of 1 MPa. The isotropic flexural strength of the block 13 is at least 100 kPa, in particular at least 300 kPa, in particular at least 500 kPa, in particular at least 1 MPa.

The block 13 has dimensions, which can be chosen dependent on the dimensions of the crucible 1. It can have a rectangular, in particular a square cross-section. The cross-sectional area of the block 13 is at least 25 cm$^2$, in particular at least 100 cm$^2$. The cross-section of the block 13 can be in the range between 10 cm×10 cm and 20 cm×20 cm. In longitudinal direction 6 the block 13 can be at least 5 cm high, in particular at least 10 cm high, in particular at least 20 cm high. Preferably the block 13 has an aspect ratio of at least 0.5, in particular at least 1, in particular at least 2. Here the aspect ratio denotes the ratio of the height of the block 13 to its cross-sectional diameter, in particular to its longest cross-sectional diameter.

The block 13 is attached to a graphite rod 14. The graphite rod 14 has features at the bottom to allow engagement and lifting of the block. In particular, it may have spiral screw threading 15 at the bottom. The threads 15 of the graphite rod 14 are screwed into the block 13, which can but need not necessarily have matching threads 16 if the hole is slightly undersized. The graphite rod 14 forms a holding element. The block 13 is held at one end, in particular at one end only.

Instead of the graphite rod 14 the holding element can comprise a quartz rod or even a refractory metal rod. A refractory rod has better toughness and lower brittleness than the other options, but may introduce contaminants or it may react with the sponge material.

The graphite rod 14 is itself attached to a displacement mechanism 17. The displacement mechanism 17 is adapted for vertically displacing the block 13. By means of the displacement mechanism 17 the block 13 can be displaced, i.e. moved relative to the crucible 1, in particular relative to the silicon melt contained therein. The block 13 can in particular be lowered and raised by means of the displacement mechanism 17.

The displacement mechanism 17 comprises an actuator 18, in particular a motorized actuator 18.

The displacement mechanism 17, in particular the actuator 19, is in signal connection to a controller 19. By means of the controller 19 the displacement of the block 13 relative to the crucible 1 can be controlled. The controller 19 can be an open circuit controller. Preferably, the controller 19 is a closed circuit controller. Thus, it preferably comprises at least one sensor 20 for monitoring at least one parameter of the block 13. The sensor 20 can in particular be adapted to monitor the position, in particular the relative position of the block 13 with respect to the crucible 1, in particular with respect to the silicon-melt therein. It is in particular possible to monitor the relative position of the block 13 with respect to the top surface of the liquid silicon layer 22 and/or a solidification boundary 21 of the silicon within the crucible 1.

The sensor 20 can comprise a weight sensor for monitoring the weight of the block 13. By that it is easily possible to monitor the amount of silicon soaked up by the block 13.

According to one embodiment of the invention the block 13 can be provided with a separate temperature controller 23. By that, the temperature of the block 13 can be controlled to be in a predetermined range during predetermined phases of the process. By means of the temperature controller 23 it is in particular possible to heat the block 13. It can also be advantageous, if the temperature controller 23 comprises a cooling device for cooling the block 13.

The crucible 1 is part of an apparatus 24 for solidifying a silicon-melt. The apparatus 24 comprises besides the crucible 1 and the device 12 at least one heating device 25. The heating device 25 comprises at least one side heater 26 and at least one top heater 27. The heaters 26, 27 may have separately controllable sections. They are preferably connected to a temperature controller 28 for details of the general embodiment of the apparatus 24, in particular the heating device 25 reference is made to DE 10 2005 013 410 B4, which is hereby incorporated in its entirety by reference. Furthermore, the apparatus 24 preferably comprises a cooling device 29. The cooling device 29 is arranged at the bottom of the crucible 1; it is arranged in particular below the crucible 1. It is preferably connected to the temperature controller 28. It can have an adjustable cooling tower.

Furthermore, the apparatus 24 comprises an enclosure 30 for enclosing the crucible 1. The enclosure 30 can be provided with a gas exchange device 31 for controlling the composition and/or the pressure of the atmosphere within the enclosure 30. For details thereof reference is made to DE 10 2011 002 599 A1.

In the following the method for manufacturing silicon-block 4 according to the present invention is described with reference to FIG. 8. For different phases of the process reference is made to FIGS. 3 to 7.

To start with, in a first step 32 the apparatus 24 for solidifying a silicon-melt is provided.

In a second step 33 a silicon-melt is provided within the crucible 1. For that, solid silicon can be melted within the crucible 1. It is likewise possible to melt the silicon in a separate container and poor it into the crucible 1 in liquid form.

Then the silicon-melt within the crucible 1 is partly solidified in a first solidification process 34. The first solidification process 34 is a directional solidification process, wherein the silicon-melt in the crucible 1 is solidified from the bottom 2 towards the top 3. In the following the first solidification process 34 is also referred to a first solidification phase, as it is a phase of the entire solidification process.

Figure 7:
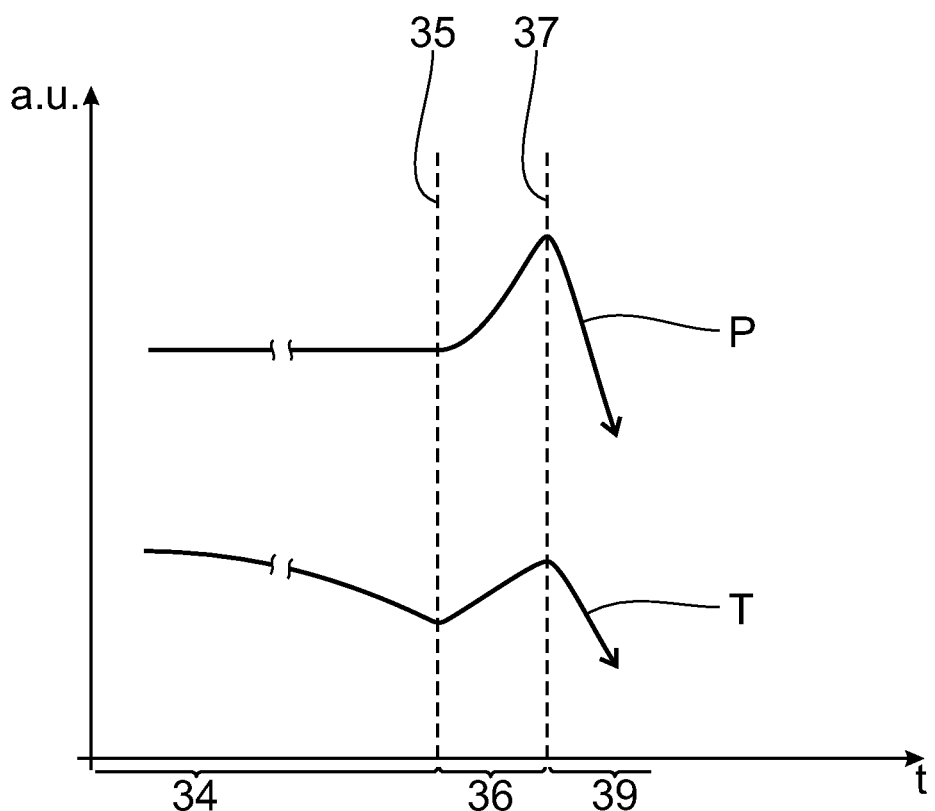
FIG. 7 shows a diagram showing an exemplary time course of heating power and temperature of the liquid silicon and FIG. 8 shows a schematic diagram to summarize the main process steps of a method for manufacturing silicon-blocks according to the present invention.
Figure 8:
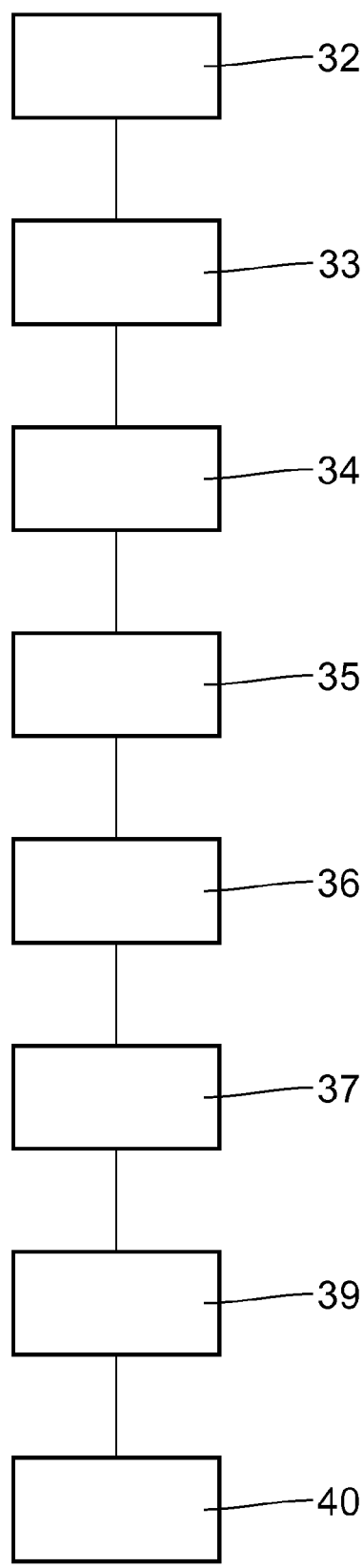

In FIG. 7 an exemplarily time course of heating power P applied to the heating device 25 and temperature T of the topmost layer 22 of liquid silicon in the crucible 1 is depicted in arbitrary units. Whereas the heating power P is held constant during the first solidification phase 34, the temperature T of the topmost layer of liquid silicon at first remains rather constant, but decreases slightly towards the end of the first solidification phase 34.

Figure 3:
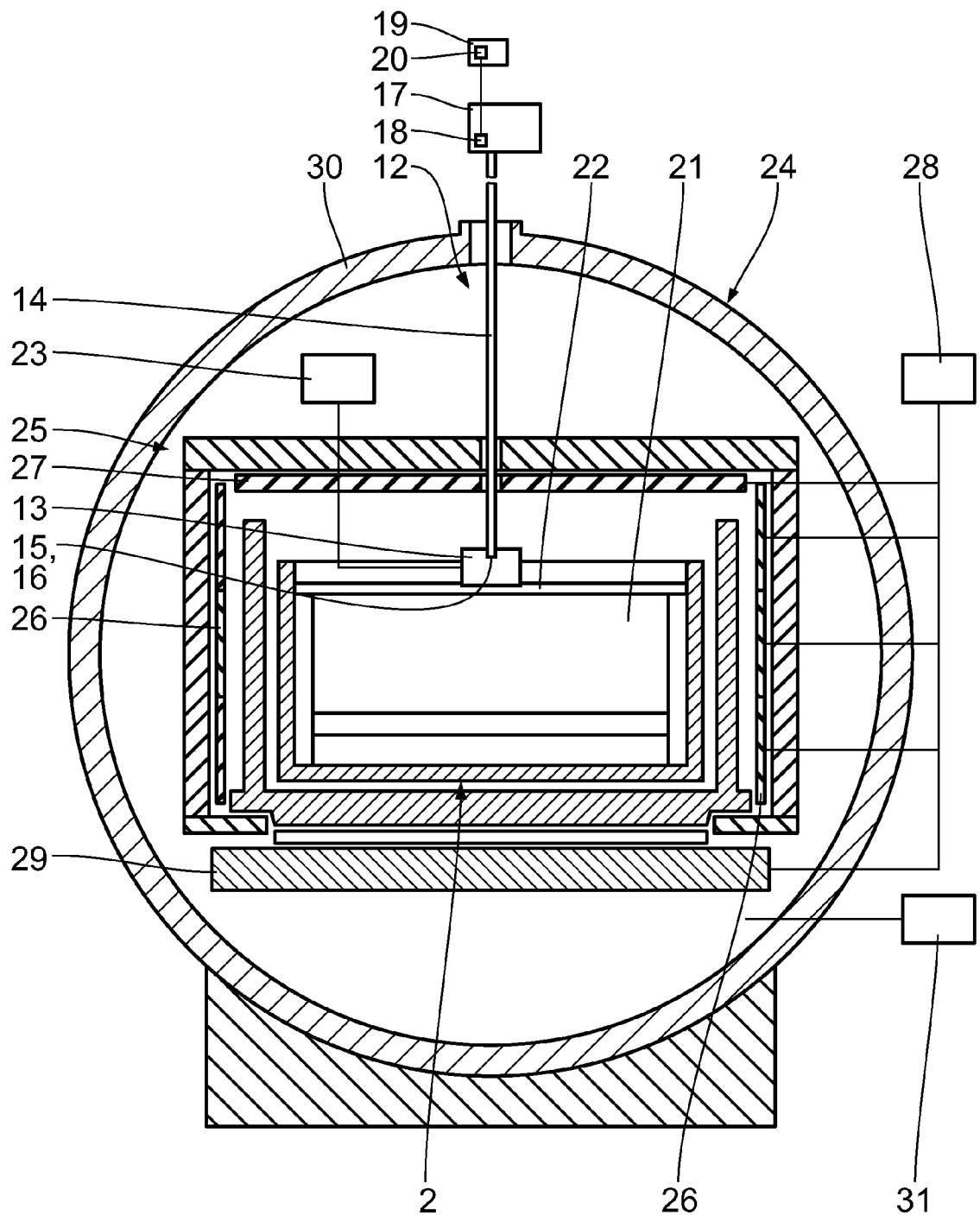
FIG. 3 shows a cross section though an apparatus for solidifying a silicon-melt according to an embodiment of the invention at a time point, when there is still a layer of liquid silicon on top of the already solidified silicon.
Figure 4:
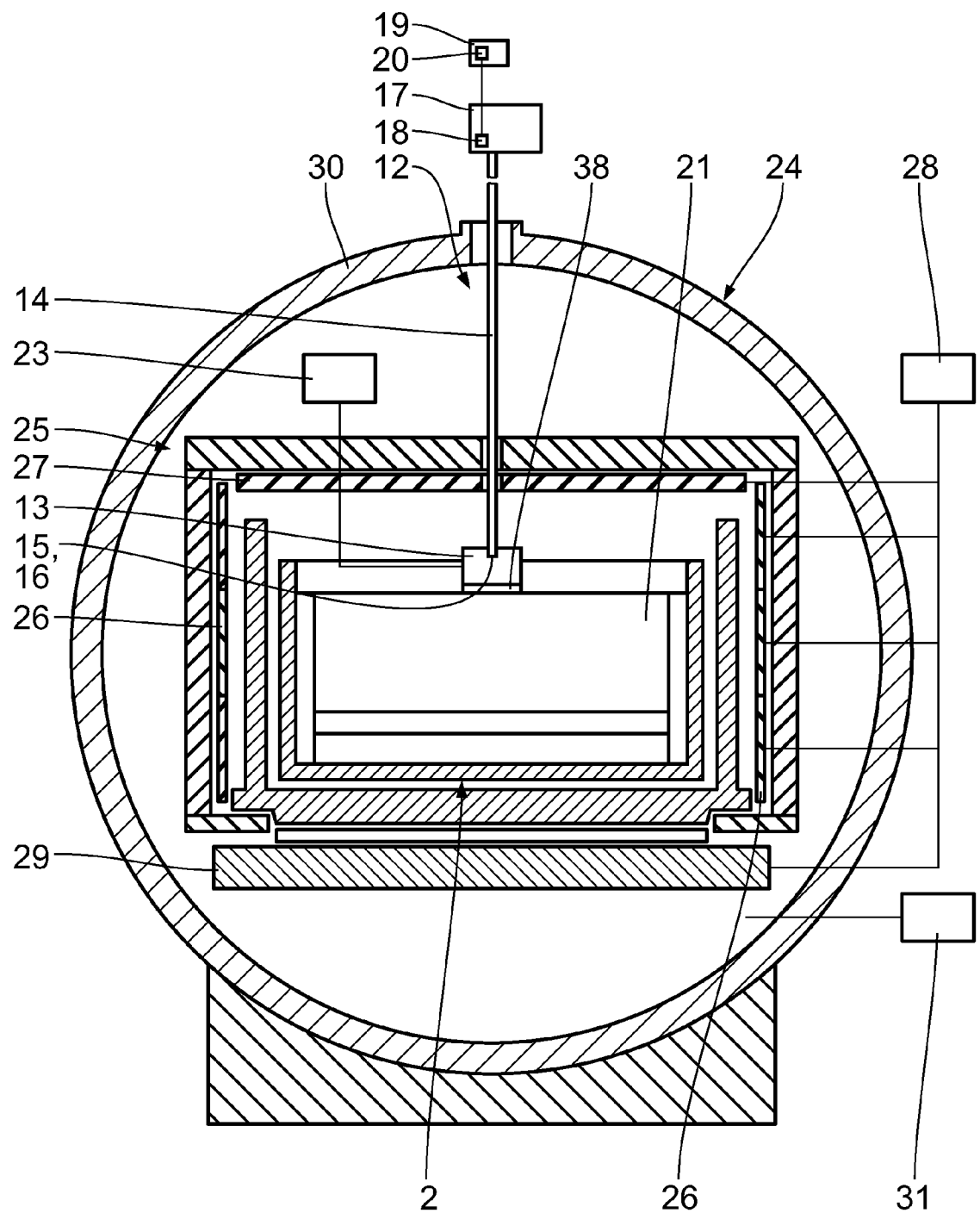
FIG. 4 shows a cross section of the apparatus according to FIG. 3 at a time point when most of the liquid silicon has been soaked up by an impurity sponge.

Once the solidification of the silicon-melt in the crucible 1 has proceeded to a predetermined level, for example to the point where 95% of the silicon in the crucible 1 is solid, the block 13 is brought in contact with the liquid silicon on top of the solid silicon in the crucible 1 in a contacting step 35. The moment when the block 13 is brought in contact with the liquid silicon is shown in FIG. 3. At this point the block 13 has not soaked up any liquid silicon yet. For bringing the block 13 in contact with the liquid silicon, it is lowered by means of the displacement mechanism 17. The lowering of the block 13 can be performed in a controlled way. It is in particular possible, to monitor the relative position of the block 13 to the topmost layer 22 of liquid silicon by means of the sensor 20. The contacting step 35 is preferably initiated, when the total volume of the topmost layer 22 of liquid silicon falls below a predetermined value. Clearly, a given volume of liquid silicon corresponds to a given total mass of liquid silicon. Alternatively, the lowering of the block 13 can be initiated, when the topmost layer 22 of liquid silicon has a height in the longitudinal direction 6, which falls below a certain value, in particular below 1 cm.

With the initiation of the contacting step 35 the heating power of the heating device 25 is increased. It is in particular increased by at least 5%, in particular at least 10%, in particular by at least 15%. By that, the unwanted freezing of the remaining liquid of the topmost layer 22 can be avoided.

Simultaneously with the increase of the heating power the cooling being applied by the cooling device 29 below the crucible 1 is decreased. The cooling being applied by the cooling device 29 can in particular be turned off completely at the initiation of the contacting step 35.

Once the block 13 has been brought in contact with the topmost layer 22 of liquid silicon it is raised again slightly. It can be raised by as little as 1 mm. Thus, the block 13 is not being submerged in the topmost layer 22 of liquid silicon, and contact with the solid/liquid interface is avoided.

After the block 13 has been brought in contact with the topmost layer 22 of liquid silicon at least a predetermined amount of the liquid silicon in this topmost layer 22 is taken up by the block 13 in a taking up process 36. The liquid silicon is soaked up by the block 13. It is absorbed by the block 13. In other words, the liquid silicon is removed from the crucible 1 by being taken up by the block 13. It has been found that, in case of a block 13 made of the material comprising carbon, some of the silicon being soaked up by the block 13 reacts with the material of the block 13 to form silicon carbide (SiC). However, the silicon carbide being formed occupied only up to 20% of the total pore volume of the block 13.

The temperature of the silicon in the topmost layer 22 can be increased by 10° C. to 20° C. during the taking up step 36. This is useful to prevent uncontrolled freezing of the liquid as the solid is exposed during the soaking process.

Figure 5:
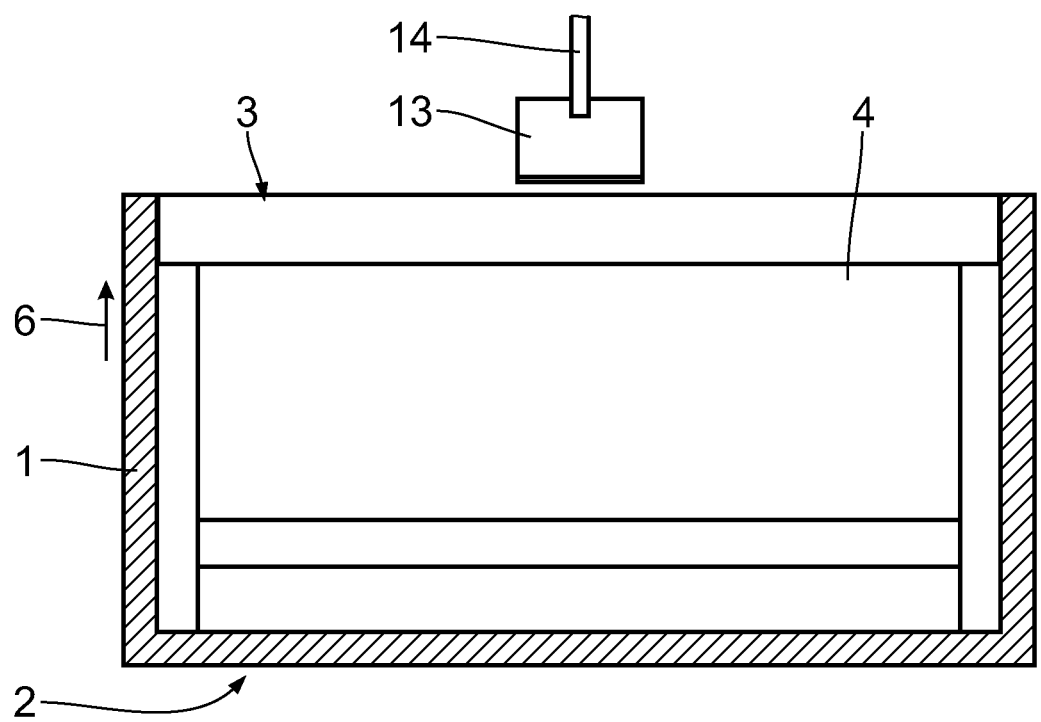
FIG. 5 shows a cross section according to FIG. 3 at a time point, when the impurity sponge is lifted clear of contact with the silicon in the crucible.

The situation at the end of the taking up process 36 is shown in FIG. 5. At this point all the liquid silicon from the topmost layer 22 of liquid silicon is soaked up by the block 13 except for a small melt puddle 38 just below the block 13. Depending on the process temperature and the block size, the soaking process can take as little as 10 minutes, but may take up to an hour. Even at one hour of duration, this process is considerably faster than the process of solidification of this liquid would have been. In order to properly control the solidification of the last liquid and to avoid dendritic crystallization that can trap liquid and produce cracks in the ingot, a process time of 4-8 hours is generally needed. Furthermore, there is an opportunity to turn down the cooling from the bottom during the soaking phase, effectively achieving some of the post-growth 'anneal' step during the soaking. This can cut further time from the cycle.

In addition to metallic contaminants, other elements such as carbon and nitrogen also build up in the liquid. Once their concentrations reach certain critical levels, silicon carbide and silicon nitride particles will start nucleating in the melt. The particles are another source of trouble for the ingots, making the processing and recycling of silicon ingots difficult. In the case where the last liquid is soaked up, much of the precipitation of these particles can be avoided, leaving a cleaner and easier to cut surface behind The entire time between the initiation of the contacting step 35 and the initiation of the removal step 37 is at most 2 hours. After the taking up step 36 the block 13 is brought out of contact with the silicon the crucible 1 in a removal step 37. For that, the block 13 is raised by means of the displacement mechanism 17. The situation after the block 13 has been raised in the removal step 37 is shown in FIG. 5.

After that the crucible 1 with the solidified silicon-block 4 is allowed to cool down in a cooling down step 39.

Figure 6:
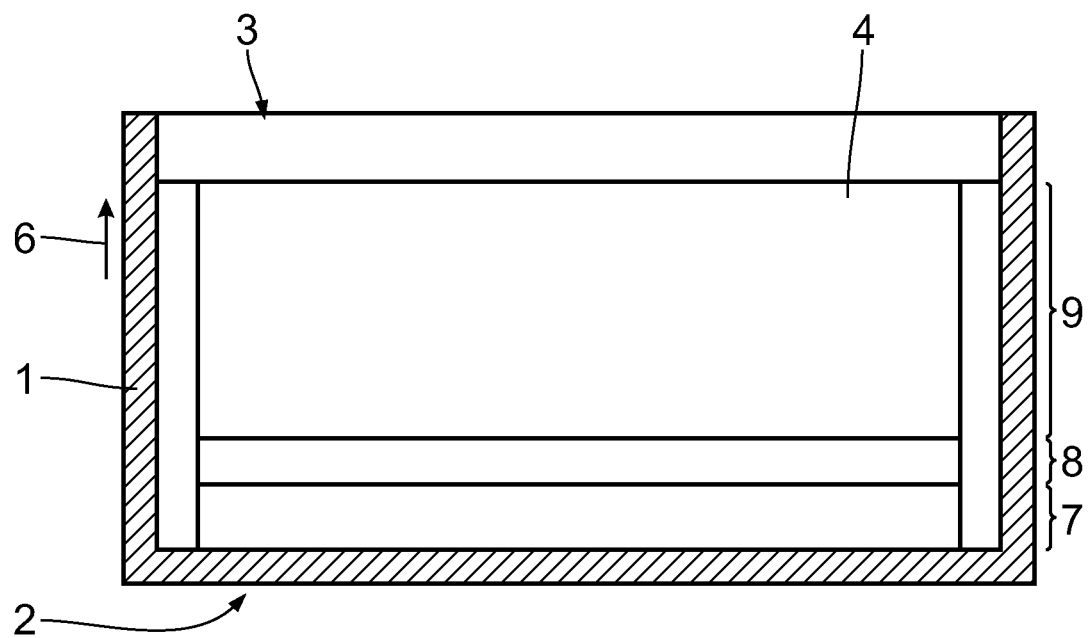
FIG. 6 shows a cross section of the ingot according to FIG. 5 after removal from the crucible.

In a second removal step 40 the silicon block 4 is removed from the crucible 1. The final silicon-block 4 is shown in FIG. 6. As can be seen from FIG. 6, except from the bottommost layer 7 and the bottom gradient layer 8 which can also be distinguished in the silicon-block 4 manufactured according to the method described above, the silicon-block has a very high charge carrier lifetime, in particular a low metal content, preferably below $1 \times 10^{13}$ atoms/cm$^3$, throughout most of its height. In particular, the layer 9 with high quality silicon has an extension in the longitudinal direction 6 of at least 60%, in particular at least 70%, in particular at least 80% of the entire height of the silicon-block 4.

The layer 9 with high quality silicon has in particular an extension, which reaches until the top 3 of the silicon-block 4.

Thus, with the method according to the present invention the yield and quality of the silicon is increased. In addition, the time to manufacture the silicon-blocks 4 is decreased, since the taking up process 36 takes much less time than what is needed for solidifying the topmost layer 22 of liquid silicon.

During the taking up step 36 the block 13 can be lowered to account for the decreasing amount of liquid silicon in the topmost layer 22. However, this is not absolutely necessary, as the liquid silicon is drawn to the area just below the block 13 on its own.

To determine the time, when the taking up process 36 has been completed and/or when the removal step 37 is to be initiated, the weight increase of the block 13 can be monitored. By this, the amount of liquid silicon soaked up by the block 13 is monitored. In addition to that or alternatively, the amount of liquid silicon in the topmost layer 22 can be monitored. Alternatively, the removal step 37 can be initiated after a predetermined, fixed time after the initiation of the contacting step 35.

In another embodiment of the invention, the block 13 is swept across the surface of the solidified silicon in a crucible 1 during the taking up process 36. It is in particular swept from one side of the top surface to the other. By that, secondary phase inclusions can be swept off from the majority of the surface. In this embodiment the displacement mechanism 17 allows for a displacement of the block 13 in a direction perpendicular to the longitudinal direction 6. In general, the block 13 can be moved across the surface of the solidified part of the silicon of the crucible 1 during the taking up process 36. It can in particular be moved parallel to the surface of the solidified part of the silicon in the crucible 1. In principle, it is possible to move the block 13 along an arbitrary, predetermined three-dimensional trajectory during the process, in particular during the taking up step 36.

In the case where a line of insulation is swept across the top of the ingot during soaking, there is an additional benefit where precipitates and particles in the melt can be sequestered to one side of the crucible, and may even stick to the sponge. In this way, the surface of the resulting ingot is yet cleaner than without the sweep.

This embodiment can also be combined with the embodiment described above. In particular, it is possible to first sweep across the liquid to sequester most of the particles floating on the liquid and then to soak up most of the liquid silicon in the topmost layer 22 in the sweeper. With additional complexity, it would be possible to have separate wiper and sponge blocks with independent control.

What is claimed is:

1. A method for manufacturing silicon blocks (4) comprising the following steps:
   a. providing an apparatus (24) for solidifying a silicon melt, the apparatus comprising
      i. a crucible (1),
      ii. a temperature controller (23) connected to at least one heating device (26, 27), and
      ii. a device (12) for removing liquid silicon from a crucible, the device comprising at least one block (13) of a refractory with a capillary structure,
   b. providing a silicon melt within the crucible (1),
   c. partly solidifying the silicon melt,
   d. bringing the at least one block (13) of the refractory in contact with liquid silicon on top of the solidified silicon in a contacting step,
   e. taking up at least a predetermined amount of the liquid silicon with help of the at least one block (13) in a taking up step, and
   f. bringing the at least one block (13) of the refractory out of contact with the silicon in the crucible (1) in a removal step.

2. A method according to claim 1, wherein at least one of a heating power and a temperature is increased during at least part of the taking up process.

3. A method according to claim 2, wherein at least one of the heating power and the temperature is increased during the taking up step such that at least some of the liquid silicon on top of the solidified silicon is prevented from solidifying.

4. A method according to claim 1, wherein the block (13) of a refractory is moved across a surface of a solidified part of the silicon melt.

5. A method according to claim 1, wherein a cooling power applied to a bottom part of the crucible (1) is decreased during at least part of the taking up process.

6. A method according to claim 1, wherein the block (13) is raised after the contacting step.

7. A silicon block (4) manufactured according to a method comprising the following steps:
   a. providing an apparatus (24) for solidifying a silicon melt, the apparatus comprising
      i. a crucible (1),
      ii. a temperature controller (23) connected to at least one heating device (26, 27), and
      ii. a device (12) for removing liquid silicon from a crucible, the device comprising at least one block (13) of a refractory with a capillary structure,
   b. providing a silicon melt within the crucible (1),
   c. partly solidifying the silicon melt,
   d. bringing the at least one block (13) of the refractory in contact with liquid silicon on top of the solidified silicon in a contacting step,
   e. taking up at least a predetermined amount of the liquid silicon with help of the at least one block (13) in a taking up step, and
   f. bringing the at least one block (13) of the refractory out of contact with the silicon in the crucible (1) in a removal step.

\* \* \* \* \*